United States Patent
Ikeda et al.

(10) Patent No.: US 8,653,541 B2
(45) Date of Patent: Feb. 18, 2014

(54) SEMICONDUCTOR DEVICE

(75) Inventors: Kouji Ikeda, Chiba (JP); Takanori Yamashita, Chiba (JP); Masami Iseki, Mobara (JP)

(73) Assignee: Canon Kabushiki Kaisha, Tokyo (JP)

( * ) Notice: Subject to any disclaimer, the term of this patent is extended or adjusted under 35 U.S.C. 154(b) by 100 days.

(21) Appl. No.: 12/762,628

(22) Filed: Apr. 19, 2010

(65) Prior Publication Data

US 2010/0270678 A1   Oct. 28, 2010

(30) Foreign Application Priority Data

Apr. 22, 2009 (JP) .................... 2009-104213
Mar. 24, 2010 (JP) .................... 2010-068285

(51) Int. Cl.
*H01L 23/48* (2006.01)

(52) U.S. Cl.
USPC ............... 257/88; 257/401; 257/72; 257/773; 257/59; 257/40; 257/E23.01; 257/E33.066; 345/211; 345/76; 345/45

(58) Field of Classification Search
CPC ............. H01L 27/3262; G09G 3/3233; G09G 2300/0426; G09G 2300/0439; G09G 2300/0842
USPC .......... 257/773, E23.01, 292, 72, 401, 88, 59, 257/40, E33.066; 345/211, 76, 45
See application file for complete search history.

(56) References Cited

U.S. PATENT DOCUMENTS

| | | | |
|---|---|---|---|
| 7,164,399 B2 * | 1/2007 | Matsumoto | 345/76 |
| 2008/0111956 A1 * | 5/2008 | Kim et al. | 349/106 |
| 2009/0295773 A1 * | 12/2009 | Taneda et al. | 345/211 |

FOREIGN PATENT DOCUMENTS

| | | |
|---|---|---|
| CN | 1472716 A | 2/2004 |
| CN | 101226944 A1 | 7/2008 |
| JP | 3922227 B2 | 5/2007 |
| KR | 10-2008-0044050 A | 5/2008 |

* cited by examiner

*Primary Examiner* — Tom Thomas
*Assistant Examiner* — Benjamin Tzu-Hung Liu
(74) *Attorney, Agent, or Firm* — Canon U.S.A., Inc. IP Division

(57) ABSTRACT

A semiconductor device including a plurality of circuits that includes a transistor, where a semiconductor layer forming the transistor includes a first contact pad, a first part that is connected to the first contact pad and that extends in a direction intersecting a short direction of a pitch with which the circuits are arranged, a second part that extends from the first part in the short direction, and a second contact pad including the first part and the second part that are provided between the first contact pad and the second contact pad, where the second part overlaps an electrode layer across an insulating layer.

14 Claims, 11 Drawing Sheets

SEMICONDUCTOR DEVICE

BACKGROUND OF THE INVENTION

1. Field of the Invention

The present invention relates to a semiconductor device provided with a circuit including a semiconductor element and particularly relates to a semiconductor device including a circuit configured to drive a light-emitting element.

2. Description of the Related Art

In recent years, it has been expected that self light emitting-type display devices including a light emitting element such as an electroluminescence (EL) element and/or a light emission diode (LED) element will come up as next-generation display devices. Unlike a liquid crystal display (LCD) device, the self light emitting-type display device does not include a backlight and has reduced viewing-angle dependency. Of all the self light emitting-type display devices, display devices including an organic EL element which is a current control-type light emitting element, that is, organic EL display devices have received attention. In an active matrix-type organic EL display device, a thin-film transistor (TFT) is used for a pixel circuit (hereinafter often expressed simply as a pixel) and a light emitting element that are arranged on a display area, and a circuit that is provided around the pixel circuit and that generates a signal transmitted to the pixel circuit.

For increasing the image quality of the display device, a high-precision pixel, that is, a smaller pixel has been much sought after. However, the number of TFT elements included in the pixel circuit of the organic EL display device is larger than that of TFT elements included in the pixel circuit of the LCD device in most instances. Further, since a current is passed through the organic EL element to make the organic EL element emit light, a power line should be arranged on a display area. Therefore, enough thought should be given to the way of achieving a layout effective at obtaining the high-precision pixel.

The invention of the method of connecting the source of a driving TFT configured to drive the organic EL element of each pixel circuit to a power line shared by two adjacent pixels has been disclosed in Japanese Patent No. 03922227, as an exemplary high-precision pixel layout. Since two transistors are provided through the use of a single linear semiconductor area, a high layout efficiency is obtained.

However, for reducing a pitch X1 with which pixels are arranged to respond to a further request for the high-precision pixel, a driving TFT having a large share of the pixel area should be arranged with an increased efficiency. Although a source contact pad is shared by the two pixels, as is the case with Japanese Patent No. 03922227, the length of the driving transistor provided for the two pixels does not fall within the smaller pitch of the pixel in a high-precision display device. In that case, it may become difficult to arrange the driving TFT. If the driving TFT is reduced in size, variations in the properties of elements are increased and the deterioration of the driving TFT is accelerated due to an increased current density, which decreases the quality of the display device.

SUMMARY OF THE INVENTION

According to an embodiment of the present invention, a semiconductor device having a semiconductor layer, where the semiconductor layer includes a first contact pad, a first part that is connected to the first contact pad and that extends in a direction intersecting a short direction of a pitch with which the circuits are arranged, a second part that extends from the first part in the direction intersecting the short direction, and a second contact pad including the first part and the second part that are provided between the first contact pad and the second contact pad, and where the second part overlaps an electrode layer across an insulating layer.

Further features of the present invention will become apparent from the following description of exemplary embodiments with reference to the attached drawings.

DESCRIPTION OF THE EMBODIMENTS

The best mode for achieving the present invention is applied to an active matrix-type display device including an EL element such as an organic EL element. Hereinafter, an active matrix-type display device according to an embodiment of the present invention will be specifically described.

In each of the following embodiments of the present invention, an exemplary display device including an organic EL element will be described. However, without being limited to the above-described embodiments, any element that can control light emission constitutes another embodiment of the present invention.

The present invention allows for arranging pixels in a matrix with a reduced arrangement pitch in a display device. Accordingly, the present invention can be usually applied for reducing an arrangement pitch for an arbitrary one-dimensional circuit array including one-dimensional circuits arrayed in a single direction, where the circuit array includes, for example, a column driving circuit and/or a row driving circuit, and a shift register included therein.

In the case where a display device is used, the present invention presents a display device including a driving TFT which is efficiently arranged in a small high-precision pixel area.

The display device includes not only a matrix display device including pixels that are two-dimensionally arrayed, but also a linear display device including light-emitting elements that are arrayed in a line so that one-dimensional image information is displayed. The linear display device showing the image information may be used in combination with a photo conductor provided as a scanner to form an image recording device including an optical printer, a copier, and so forth. The active matrix-type display device may be used as, for example, a viewer included in a flat surface television, a digital camera, a digital video camera, etc., and a display part of a mobile phone.

First Embodiment

Figure 1:
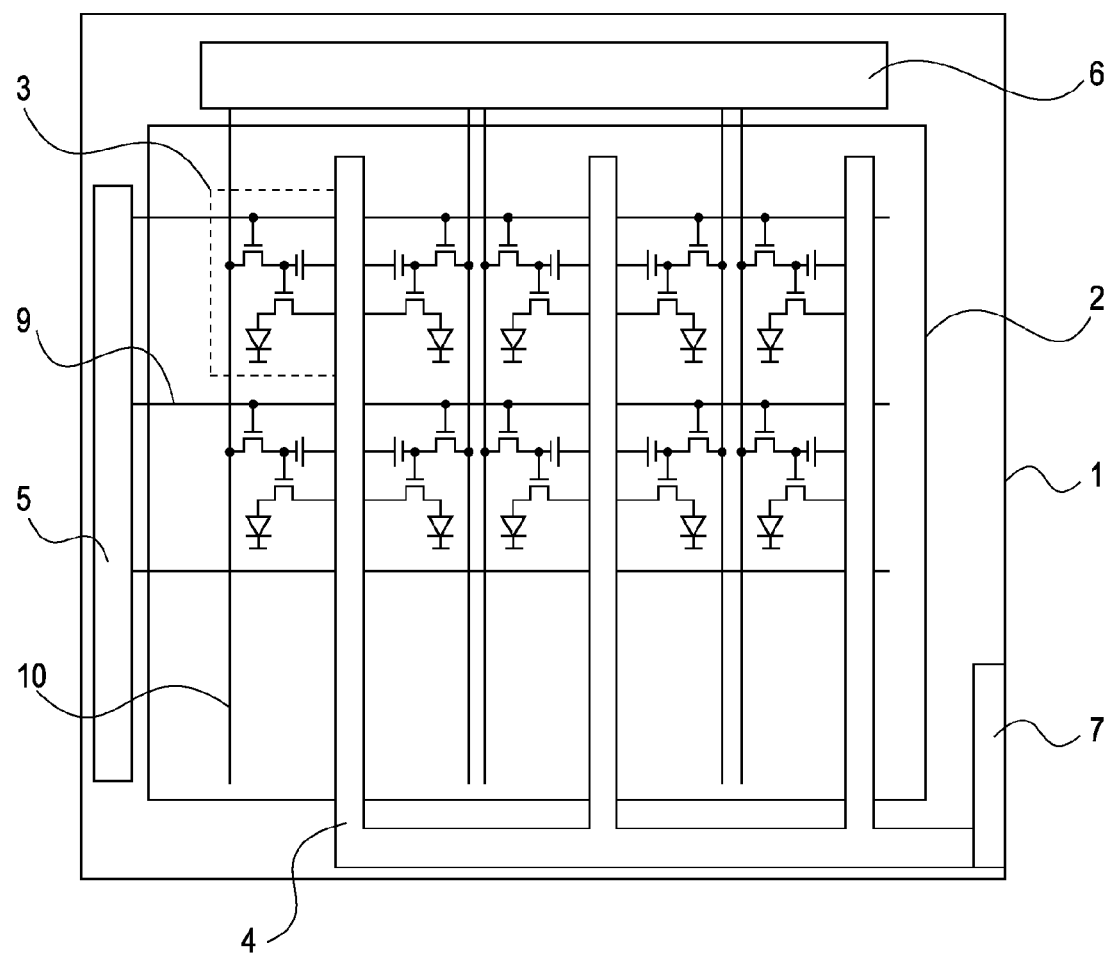
FIG. 1 is a block diagram showing a pixel circuit and a peripheral circuit of a display device.

FIG. 1 schematically shows a display device including a semiconductor device according to a first embodiment of the present invention and light-emitting elements provided on the semiconductor device.

Pixels 3 are arrayed in a two-dimensional matrix in a row direction and a column direction on a substrate 1, where each of the pixels 3 includes a light-emitting element and a circuit provided to drive the light-emitting element, so that an image display part 2 is provided. Power is supplied to each of the pixels 3 via a power line 4. The pixels 3 are supplied with a common voltage via the power line 4. Therefore, the power line 4 is arranged for every two columns of the pixels 3 to increase the layout efficiency, that is, the share of the area of the pixels 3 provided on the substrate 1. Data lines 10 are arranged in pairs at intervals of one column between the pixels 3 for which no power line 4 is arranged. Therefore, the two adjacent pixels 3 are arranged to be line-symmetric with respect to the power line 4.

Scanning lines 9 are arranged in a direction along which the rows of the image display part 2 extend (a horizontal direction in FIG. 1) and the data line 10 are arranged in a direction along which the columns of the image display part 2 extend (a vertical direction in FIG. 1). The scanning line 9 links the pixels 3 with one another in the row direction and the data line 10 links the pixels 3 with one another in the column direction.

A scanning line-driver 5 provided to transmit a scan signal to the scanning line 9 and a data line-driver 6 provided to transmit a data signal to the data line 10 are arranged around the image display part 2.

Power is transmitted from an external circuit to an end part 7 and is transmitted to the light-emitting elements via the power lines 4. The end part 7 is supplied with not only the power, but also a control signal and the power voltage thereof that are transmitted to the scanning line-driver 5 and/or the data line driver 6. However, connection lines used to transmit the control signal and the power voltage are not shown.

Figure 2:
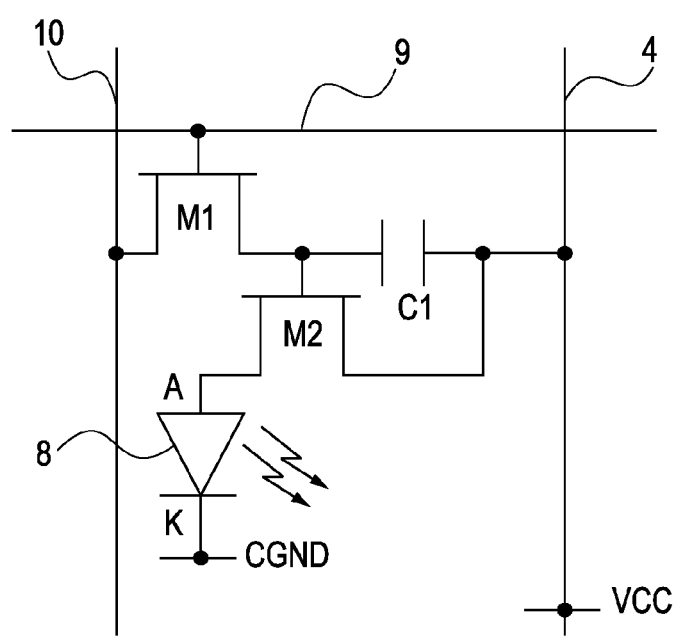
FIG. 2 is a magnified view of a pixel circuit shown in FIG. 1.

FIG. 2 is a circuit diagram showing a magnification of one of the pixels 3. The same components as those shown in FIG. 1 are designated by the same reference numerals.

An organic EL element 8, a switching transistor M1 provided to capture and transmit data of the data line 10 to the pixel 3, a driving transistor M2 provided to control the current of the organic EL element, and a storage capacitance C1 provided to hold the data are shown. The organic EL element 8 emits light having one of three colors R, G, and B.

The sign VCC indicates a power potential supplied from the power line 4, the sign CGND indicates a ground potential, and the signs A and K respectively indicate the anode and the cathode of the organic EL element 8. The anode A of the organic EL element 8 is connected to the power potential VCC via the driving transistor M2 and the cathode K is connected to the ground potential CGND. The cathode K is a common electrode connected to each of the pixels 3.

Data of the light emitted from the organic EL element is absorbed in the storage capacitance C1 over the time period during which the switching transistor M1 is turned on. Further, over the time period during which the light is emitted, a current determined based on the voltage of the storage capacitance C1 is passed from the power potential VCC to the ground potential CGND via the driving transistor M2 and the organic EL element 8.

A pixel circuit (A part obtained by subtracting the organic EL element 8 from the circuit shown in FIG. 2. Hereinafter, the pixel circuit will be simply referred to as the circuit.) may be achieved by arranging circuit elements including, for example, a transistor including a semiconductor thin film and/or wiring including a metal thin film on a substrate. Two electrodes including an anode and a cathode, and an organic layer are placed on the substrate on which the above-described circuit elements are provided. Consequently, the organic EL element is achieved.

Figure 3:
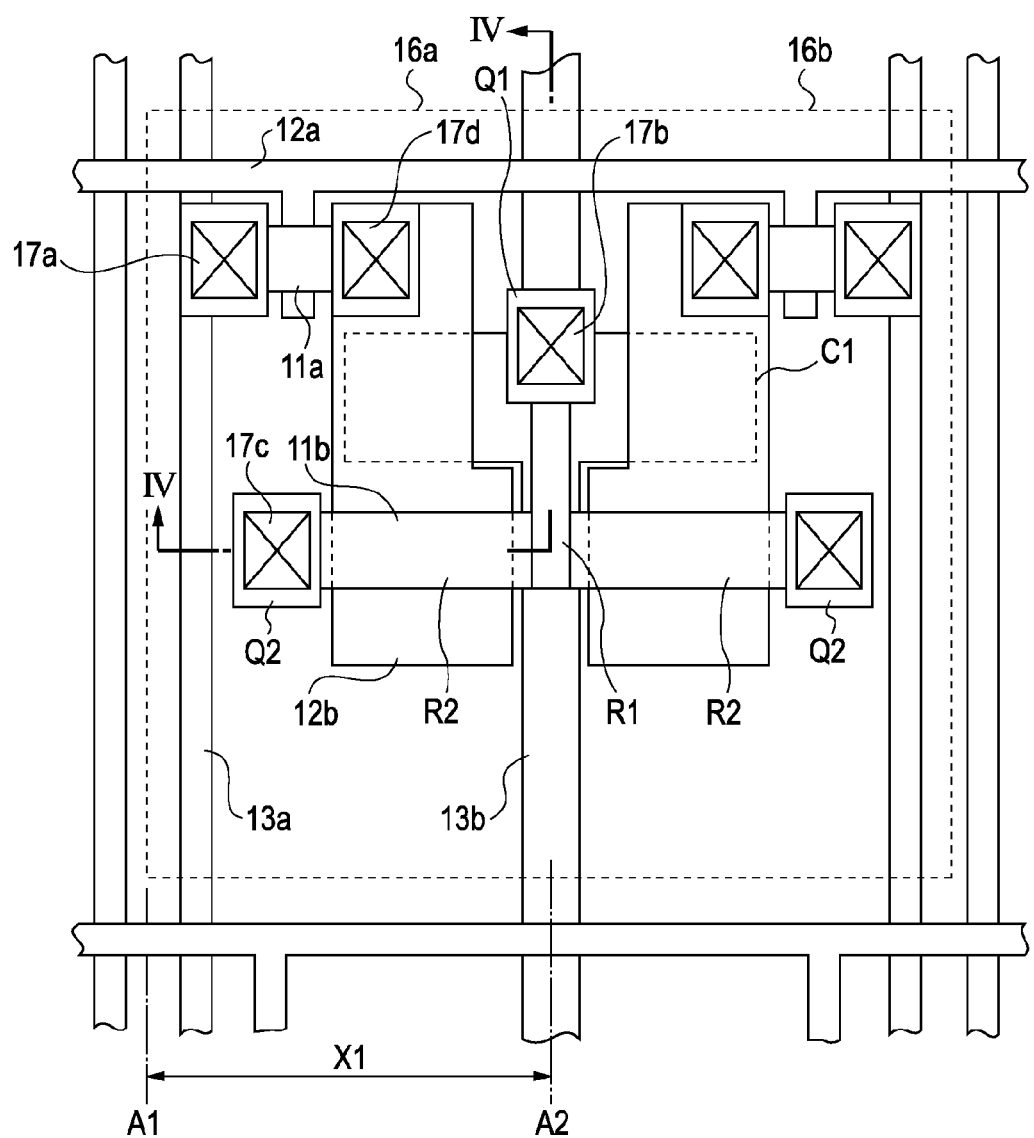
FIG. 3 shows a layout of a pixel circuit according to a first embodiment of the present invention, the pixel circuit being provided as a semiconductor device.

FIG. 3 shows the circuit elements of the two adjacent pixel circuits, the circuit elements being laid out on the substrate. Hereinafter, the layout shows the circuit elements viewed from the substrate side.

In a pixel circuit 16a, semiconductor layers 11a and 11b, a gate electrode layer 12a functioning as the scanning line 9, a gate electrode layer 12b functioning as one of the electrodes of the storage capacitance C1, a wiring layer 13a functioning as the data line 10, and a wiring layer 13b functioning as the power line 4 and the other electrode of the storage capacitance C1 are arranged.

The semiconductor layers 11a and 11b function as the respective switching transistor M1 and driving transistor M2 that are shown in FIG. 2. Each of the driving transistor M2 and the switching transistor M1 is a thin film transistor (TFT) including a thin film semiconductor layer.

The semiconductor layer 11b includes a straight-line part R2 that extends in a direction perpendicular to the power line 4 and/or the data line 10 and that has a fixed width. The channel of the driving transistor M2 is formed on an area where the gate electrode 12b and the part R2 overlap each other. After the gate electrode 12b is provided, a highly-concentrated impurity ion is implanted into a part of the semiconductor layer 11b, where the area does not overlap the gate electrode 12b, so that a low-resistant source area and/or a low-resistant drain area is provided. Therefore, the channel width is determined based on the dimension W of a part R2 of the semiconductor layer 11b, the dimension W being specified in the Y-direction, and the channel length is determined based on the dimension L of the gate electrode 12b, the dimension L being specified in the X-direction (a direction in which the gate electrode layer 12a, that is, the scanning line 9 extends). The X-direction translates to a short direction of a pitch with which the pixel circuits are arranged. Each of the dimension W of the semiconductor layer 11b, the dimension W being specified in the Y-direction (a direction in which the wiring layer 13a, that is, the data line 10 extends), and the dimension L of the gate electrode layer 12b, the dimension L being specified in the X-direction, is determined based on the dimension of a mask used to form a pattern through photolithography, and is not affected by a displacement occurring at the alignment time. The channel length and the channel width are determined based on an appropriate driving ability so that the mask width W obtained at the semiconductor layer-forming time and a mask width L obtained at the gate electrode-forming time are determined.

Figure 4:
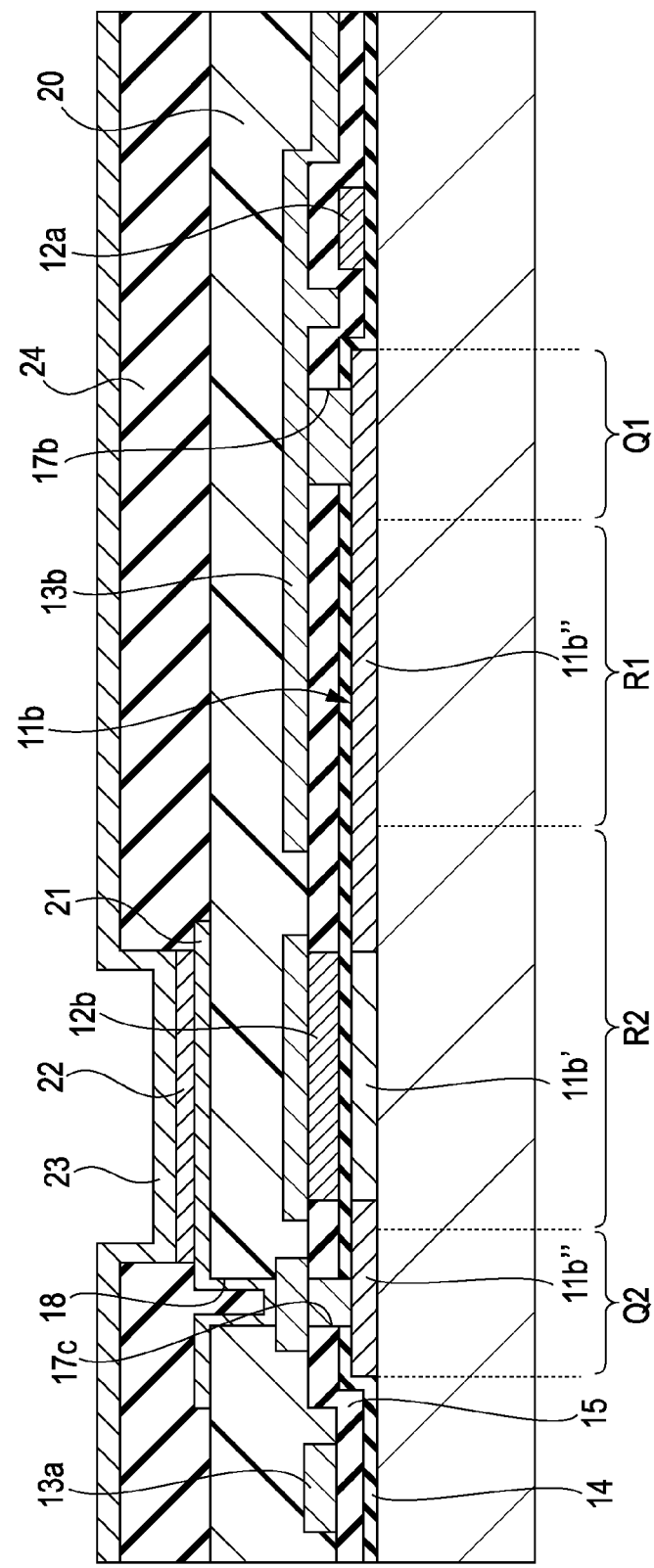
FIG. 4 is a cross sectional view taken along the line IV-IV shown in FIG. 3.

FIG. 4 is a cross sectional view taken along the line IV-IV shown in FIG. 3.

As indicated by the cross section view shown in FIG. 4, a gate insulating film 14 is provided between a semiconductor layer 11 and a gate electrode layer 12, and an interlayer insulating layer 15 is provided between the gate electrode layer 12 and a wiring layer 13. The storage capacitance C1 is formed in an area where the gate electrode layer 12b and the wiring layer 13b overlap each other across the interlayer insulating layer 15.

Contact holes 17a, 17b, 17c, and 17d that are provided to electrically connect the semiconductor layer 11 and the wiring layer 13 to each other are bored through the interlayer insulating layer 15. The contact hole 17a connects the semiconductor layer 11a included in the source (and/or the drain) of the switching transistor M to the wiring layer 13a of the data line 10. The contact hole 17b connects an end part (contact pad) Q1 of the semiconductor layer 11b included in the source of the driving transistor M2 to the wiring layer 13b included in the wiring line 4. The contact hole 17c connects an end part (contact pad) Q2 of the semiconductor layer 11b included in the drain of the driving transistor M2 to a wiring layer (not shown) provided thereon.

The contact hole 17d is bored through the gate insulating film 14 to connect the semiconductor layer 11b included in the drain (and/or the source) of the switching transistor M1 to the gate electrode layer 12b included in the gate of the driving transistor M2 and the other electrode of the storage capacitance C1.

The semiconductor layer 11b includes a first part R1 extending from the contact pad Q1 in a vertical direction (column direction) along the wiring layer 13b included in the power line 4 and a second part R2 turning from the first part R1 at the right angle. Further, another contact hole 18 is bored through a contact pad Q2 extending beyond the second part R2. The contact hole 17b and the semiconductor layer 11b indicating the contact pad Q1 including the periphery of the contact hole 17b function as the source of the driving transistor M2. The contact hole 18 and the semiconductor layer 11b of the contact pad Q2 including the periphery of the contact hole 18 function as the drain of the driving transistor M2.

The organic EL element 8 is formed on a resin layer 20 referred to as a planarization layer covering the entire pixel circuit. An anode 21 is connected to the drain of the semiconductor layer 11a of the pixel circuit via the contact hole 18 bored through the planarization layer, and an organic compound layer 22 including a light emission layer and a cathode 23 are provided on the anode 21. A light-emitting area is divided by an insulating bank layer 24.

Further, parts that are designated by the same reference numeral and that are indicated by indices a, b, etc., such as the gate electrode layers 12a, 12b, and so forth include the same material and are arranged on the same layer (the order in which layers are placed on the substrate). Further, the above-described parts are formed at the same time during the manufacturing process. When the above-described parts are collectively called, the indices are omitted.

As shown in FIG. 3, a single pixel circuit 16a is provided on a rectangular area defined by demarcation lines including a straight line A1 shown between two parallel data lines, a straight line A2 dividing the power line 4 in halves in a vertical direction, and two straight lines parallel to the upper and lower scanning lines 12a. The sign X1 indicates the short direction of the pitch with which the pixel circuits are arranged.

Then, the circuit elements of the two adjacent pixel circuits 16a and 16b are arranged to be line-symmetric with respect to two symmetry axes, that is, demarcation lines bordering on the adjacent pixel circuit. The two symmetry axes include the demarcation line A1 extending in a vertical direction in the middle of two adjacent data lines 13a and the demarcation line A2 dividing the center of the power line 4 in halves in the vertical direction.

When the circuit elements are line-symmetrically arranged, the adjacent pixel circuits 16a and 16b may share part of the semiconductor layer 11b. The wiring layer 13b included in the power line 4 is shared by the two adjacent pixel circuits 16a and 16b. Further, the driving transistor M2 of each of the two pixel circuits 16a and 16b includes the single semiconductor area 11b extending astride the two pixel circuits 16a and 16b. A part of the semiconductor area 11b, that is, the contact pad Q1 and the part R1 included in the source area is shared by two adjacent pixels that are arranged on the symmetry axes. The source of the shared semiconductor layer 11b, which functions as the source of the driving transistor M2, is connected to the power line 4 via the contact hole 17b provided on the shared contact pad Q1.

The semiconductor layer 11b of the driving transistor M2 includes:

(1) the contact pad Q1 connected to the wiring layer 13b included in the power line 4, (2) the first part R1 extending from the contact pad Q1 in the vertical direction, that is, in parallel with the symmetry axis A2, (3) the second part R2 extending from a tail end of the first part R1, that is, an end opposite to the contact pad Q1 at the right angle to the symmetry axis, and (4) the contact pad Q2 connected to a tail end of the second part R2, that is, an end opposite to the first part R1.

A corner part abutting on the first and second parts R1 and R2 is included in the first part R1. Here, the first part R1 may extend from the part abutting on the second part R2. Namely, the second part R2 may abut on not the tail end of the first part R1 but a middle part of the first part R1. However, the middle part should be defined at a position away from the contact pad Q1. Thus, the case where the second part R2 extends perpendicularly to the symmetry axis has been described as an example. However, the benefits of the present invention can be obtained when the second part R2 extends in the short direction of the pixel pitch even though the second part R2 does not extend perpendicularly to the symmetry axis.

The contact pad Q1 and the first part R1 are provided on the symmetry axes and are shared by the two adjacent pixels. The remaining part of the semiconductor layer 11b is divided into the pixel circuits 16a and 16b, and the second part R2 of the pixel circuit 16b extends opposite to the direction in which the second part R2 of the pixel circuit 16a extends (the right direction in FIG. 3).

The gate electrode layer 12b of the driving transistor M2 crosses the semiconductor layer on the second part R2 of the semiconductor layer 11b. A part of the semiconductor layer 11b, the part overlapping the gate electrode layer 12b, functions as a channel 11b' (see FIG. 4).

The contact pad Q1 and the entire first part R1 connected thereto, and a part of the second part R2 abutting on the first part R1 are included in the source area, and a part of the second part R2 connected to the contact pad Q2 is included in the drain area.

The contact holes 17a, 17b, 17c, and 17d are bored through the gate insulating film 14 and the inter layer insulating film 15 through the photolithography technology to bring a lower layer, that is, the semiconductor layer 11 into contact with an upper layer, that is, the conductive layer (the gate electrode layer 12 and/or the wiring layer 13). Considering displacements occurring when the contact holes are bored, the contact pads should have dimensions a size larger than those of the contact holes. Therefore, the contact pad Q1 of the semiconductor layer 11b is larger than the contact hole 17b.

The width L0 of the contact pad Q1 connected to the wiring layer 13b included in power wiring via the contact hole 17b, the width L0 being specified in the X-direction, is determined based on the width of the contact hole 17b and that of the semiconductor layer surrounding the contact hole 17b. Further, the width L4 of the contact pad Q2 connected to a wiring layer (not shown) provided on the contact pad Q2 via the contact hole 17c, the width L4 being specified in the X-direction, is also determined based on the width of the contact hole 17c and that of the semiconductor layer surrounding the contact hole 17c. The lowest size of each of the above-described contact holes is determined to reduce the contact resistance between a semiconductor and a power wiring metal, where the contact resistance occurs when a current passes through each of the contact holes.

The X-direction width of the first part R1 of the semiconductor layer 11b, the first part R1 extending from the contact pad Q1 along the symmetry axis A2, is smaller than the width L0 of the contact pad Q1, the width L0 being specified in the X-direction (the short direction of the pitch with which the pixel circuits are arranged) for the following reasons.

Impurities are added to the semiconductor layer 11, except in an area where the channel is formed, through the ion implantation achieved by using the gate electrode layer 12 as a mask. Consequently, the semiconductor layer becomes low resistant. The resistance value may be arbitrarily reduced by adjusting the concentration of the impurities. Since the resistance value of the first part R1 of the semiconductor layer 11b, the first part R1 connecting the contact pad Q1 to the channel, is sufficiently low, the X-direction width may be reduced to the extent that a pattern can be formed through the photolithography technology. As a result, the X-direction width of the first part R1 which is the semiconductor layer part provided between the contact pad and the channel becomes smaller than the width of the contact pad (ditto for a third part R3).

On the other hand, the X-direction length and the Y-direction width of the second part R2 of the semiconductor layer 11b, where the channel is formed on the second part R2, are determined based on the respective channel length and channel width of the driving transistor M2. (Since the corner part abutting on the first part R1 is not used to form the channel, the corner part is not included in the second part R2 as described above.) Theoretically, the entire second part R2 can be used as the channel. However, the length of the gate electrode which overlaps the second part R2 so that the channel is defined is determined to be shorter than that of the second part R2 in consideration of displacements occurring when the gate electrode is formed through the photolithography.

It should be arranged that a large current passes through the driving transistor M2 when the EL element is made to emit light of high intensity and a leakage current does not pass through the driving transistor M2 when the EL element does not emit light. Therefore, the channel length and the channel width of the driving transistor M2 should be larger than those of the switching transistor M1. The area of the second part R2 has a large share of the pixel circuit area 16. Further, each of the contact hole 17b and the contact pad provided under the contact hole 17b should have a large size to reduce the contact resistance.

Thus, the semiconductor layer 11b of the driving transistor M2 has a large share of the pixel area on the whole.

According to the line-symmetry layout, the power line 4 is provided on every other demarcation line bordering on a pixel to supply power to pixel circuits provided on both sides of the demarcation line. The source terminal of the driving transistor M2 is connected to the power line 4. The source area of the semiconductor layer 11b is shared by the adjacent pixels and the contact hole 17b which is a part bounded by the power line 4 is placed on the symmetry axis A2 so that the area taken up by the semiconductor layer 11b can be reduced to an extent. For achieving the above-described configuration, the semiconductor layer 11b and the pattern of wiring connected to the semiconductor layer 11b are flipped and laid out line-symmetrically between the adjacent pixels according to an embodiment of the present invention.

When the contact pad of the source is provided on the symmetry axis A2, the second part R2 of the semiconductor layer, the second part R2 forming the channel, extends in a direction perpendicular to the symmetry axis A2. When a pitch with which the pixel circuits are arranged, that is, a dimension X1 defined in a direction in which the pixels are arranged (the X-direction) is small, the X-direction length of the entire semiconductor layer 11b should be reduced as much as possible. Particularly, when the pixel circuit area is a rectangle extending in the direction of the power line 4 (the Y-direction), the channel length of the driving transistor extends in the direction of the width of the rectangle of the pixel area (the X-direction). Therefore, the dimension of the semiconductor layer, the dimension specified in the channel length direction, should be reduced to achieve a small pixel size.

According to an embodiment of the present invention, the semiconductor layer 11b included in the driving transistor M2 is provided as a bent pattern. Consequently, the share of the channel length-direction dimension of the semiconductor layer 11b held by the dimension of the contact pad can be reduced so that a driving transistor ready for a high-precision pixel pitch can be achieved.

Figure 5:
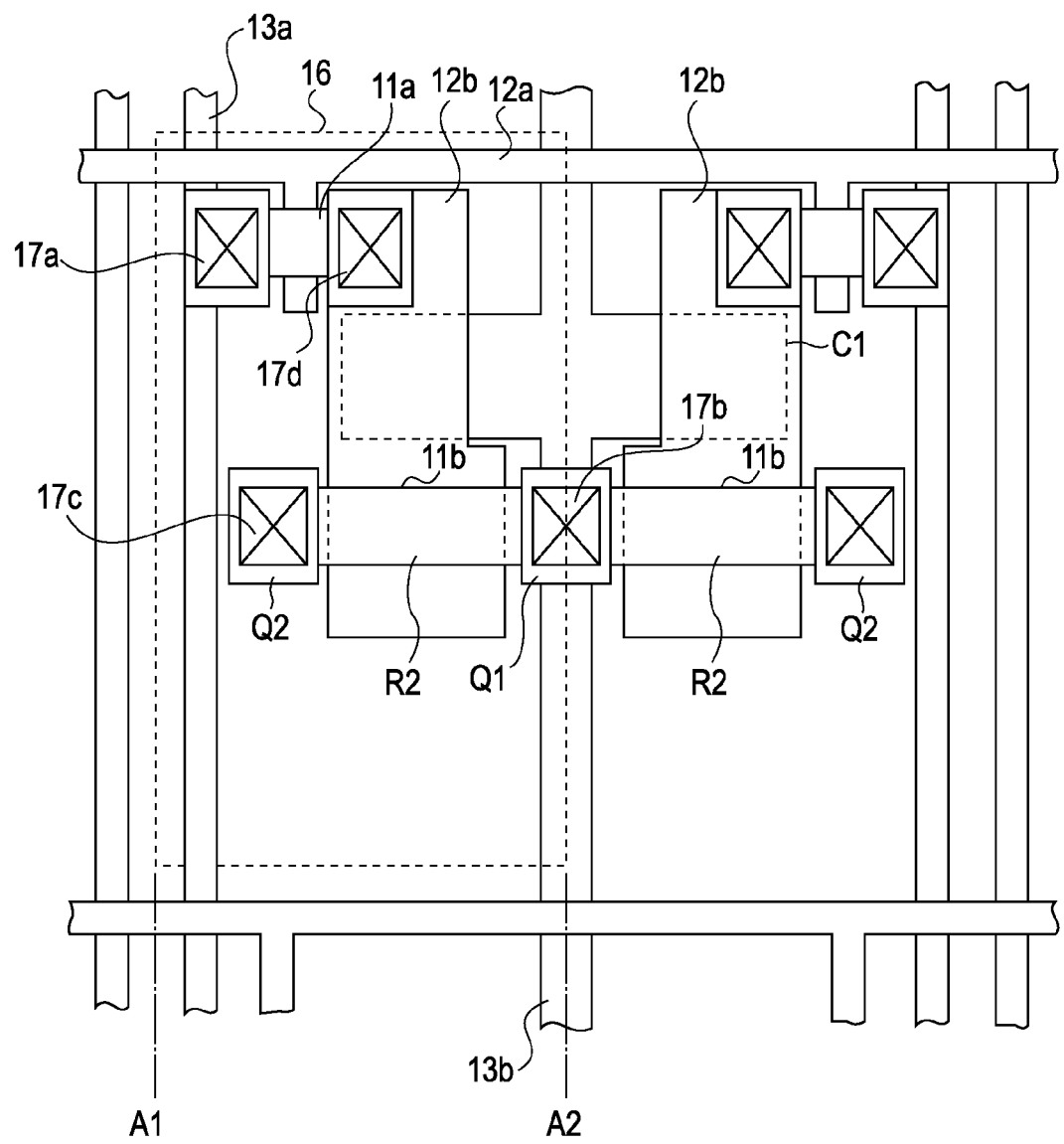
FIG. 5 shows a layout of an exemplary pixel circuit provided for comparison.

For the sake of comparison, FIG. 5 shows an example where the driving transistor includes the semiconductor layer 11b which is unbent and linear.

FIG. 5 shows a layout of a pixel circuit which is the same as that shown in FIG. 3 except that the shape of the semiconductor layer 11b shown in FIG. 5 is different from that of the semiconductor layer 11b shown in FIG. 3. Unlike the bent shape of the semiconductor layer 11b shown in FIG. 3, the semiconductor layer 11b having a linear shape does not have the first part R1 and the second part R2 extends directly from the contact pad Q1. The rest of the layout shown in FIG. 5 is the same as that of the layout shown in FIG. 3. The channel length and the channel width of the transistor, the dimensions of the contact holes, and the wiring width that are shown in FIG. 5 are entirely the same as those shown in FIG. 3. Further, the way of determining the dimensional margin considering displacements occurring when the above-described configuration is achieved through the photolithography technology in the example shown in FIG. 5 is also the same as that achieved in the example shown in FIG. 3.

Figure 6A:
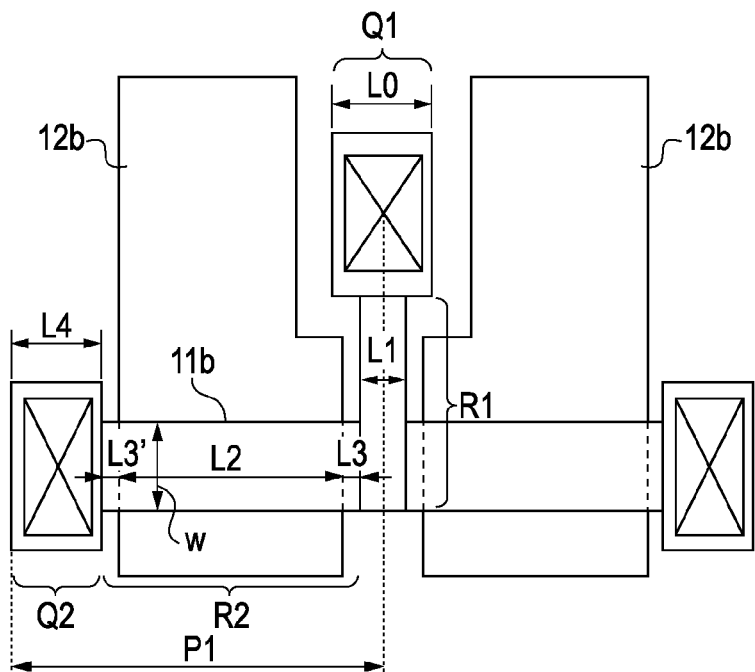
FIG. 6A shows a semiconductor layer and a gate metal layer that are extracted from FIG. 3.
Figure 6B:
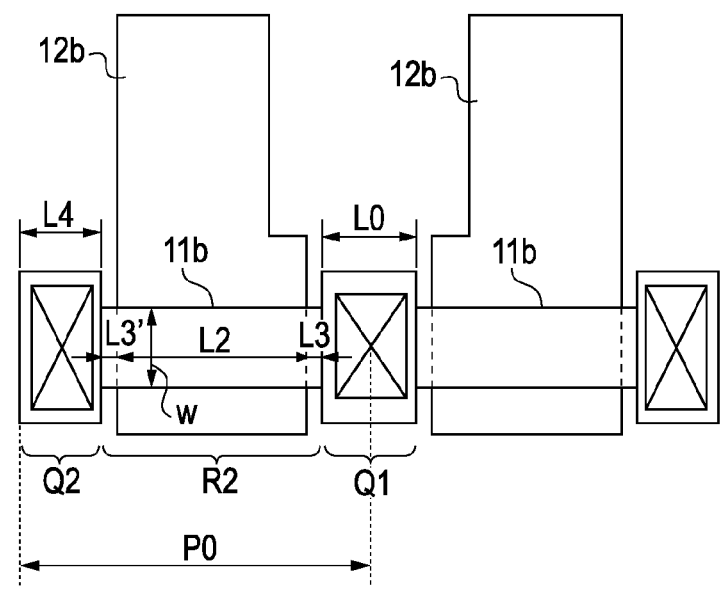
FIG. 6B shows a semiconductor layer and a gate metal layer that are extracted from FIG. 5.

FIG. 6A shows the semiconductor layer and the gate electrode layer that are extracted from FIG. 3. FIG. 6B shows the semiconductor layer and the gate electrode layer that are extracted from FIG. 5.

The size of the semiconductor layer 11b included in the driving resistor, the size being defined in the pixel width direction (the X-direction), corresponding to the bent pattern of the semiconductor layer 11b shown in FIG. 6A, the bent pattern being achieved according to an embodiment of the present invention, is compared to that corresponding to the linear pattern of the semiconductor layer 11b shown in FIG. 6, the linear pattern being exemplarily shown for the sake of comparison.

Since the channel should have the constant width, the gate electrode layer should overlap the second part R2 of the semiconductor layer 11b. Therefore, in the case where the bent pattern shown in FIG. 6A is used, each of a distance L3 between the first part R1 of the semiconductor layer 11b and the right edge of the gate electrode 12b, and a distance L3' between the contact pad Q2 and the left edge of the gate electrode 12b should have a given value or more considering mask alignment deviations occurring in the photolithography process. Taking the above-described margin into account, the X-direction length of the driving transistor M2, the length being measured from the symmetry axis A2, is expressed by the following equation:

$$P1=L1/2+L2+L3+L3'+L4.$$

On the other hand, in the case where the linear pattern shown in FIG. 6B is used, each of a distance L3 between the contact pad Q1 and the right edge of the gate electrode 12*b*, and a distance L3' between the contact pad Q2 and the left edge of the gate electrode 12*b* should have a given value or more.

According to FIG. 6B, the length of the driving transistor M2 measured from the symmetry axis A2 is expressed by the following equation:

$$P0=L0/2+L2+L3+L3'+L4.$$

The X-direction dimension L0 of each of the contact pads Q1 and Q2 that are shown in FIG. 6A is the same as that of each of the contact pads Q1 and Q2 that are shown in FIG. 6B. The mask alignment deviations occurring in the example shown in FIG. 6A are expected to be the same as those occurring in the example shown in FIG. 6B. Therefore, the margins L3 and L3' that are determined taking the mask alignment deviations into account according to FIG. 6A should have the same values as those of the margins L3 and L3' that are shown in FIG. 6B. However, since the inequality P0>P1 is derived from the inequality L0>L1, the bent semiconductor layer 11*b* is used instead of the linear semiconductor layer 11*b* for reducing the X-direction length of the semiconductor layer 11*b*.

The difference between the widths P0 and P1 denotes the difference between the shape of the semiconductor layer extending directly from the contact hole 17*b* in the X-direction and that of the bent semiconductor layer including the first part R1 extending from the contact hole 17*b* along the symmetry axis A2 in the Y-direction and the second part R2 extending from the edge of the first part R1 in the X-direction. That is to say, the semiconductor layer is bent so that the contact pad Q1 is placed at a position away from the extension of the channel and is replaced by the first part R1. Since no contact hole is bored through the first part R1, the width of the first part R1 may be smaller than that of the contact pad Q1. As a result, the X-direction length of the transistor M2 may be reduced, which makes it possible to achieve a pixel layout with high precision and a small pitch that are attained by the reduced X-direction length.

Without being limited to the pixel circuit shown in FIG. 2, a different pixel circuit may be used. For example, a pixel circuit including a common electrode functioning as the anode A of the organic EL element is may be used, and a pixel circuit including three or four TFTs may be used. Further, the pixel circuit shown in FIG. 2 is a circuit attained under the voltage programming system. However, the pixel circuit may be attained under the so-called current programming system in place of the voltage programming system. Further, the pixel circuit may be attained under the voltage driving system where a voltage is applied to the organic EL element through the driving TFT used as a switch.

Figure 7:
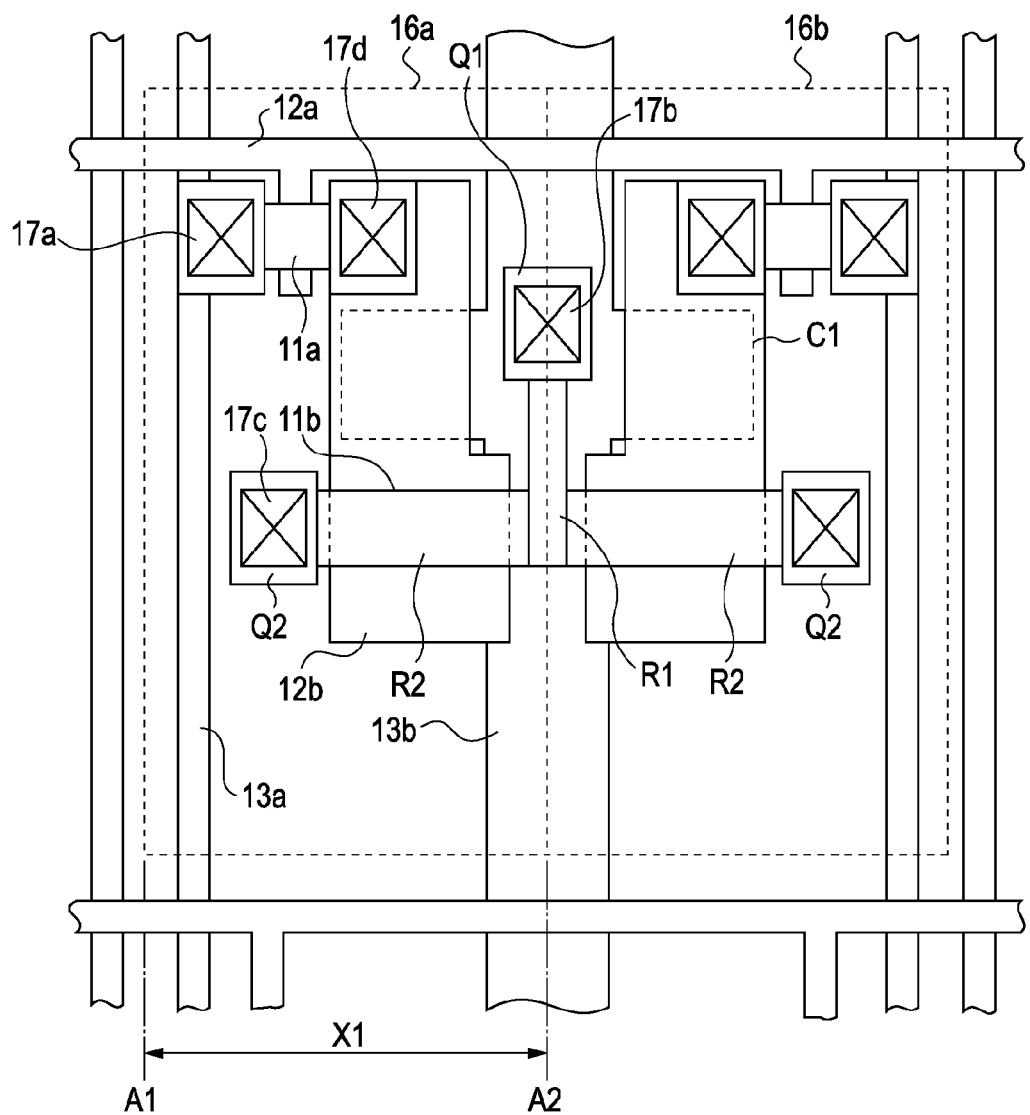
FIG. 7 shows another layout of the first embodiment.

FIG. 7 shows another layout of the pixel circuit shown in FIG. 2. The same functional components as those shown in FIG. 3 are designated by the same reference numerals.

FIG. 7 is different from FIG. 3 in that the gate electrode 12*b* of the driving transistor M2 overlaps the wiring layer 13*b* of the power line 4. Thus, the gate electrode 12*b* may be placed on the wiring layer 13*b* when the width of the wiring layer 13 is larger than the width L1 of the first part R1 of the semiconductor layer. As described above, even though the contact pad Q1 of the driving transistor is small with reference to the wiring layer 13, it becomes possible to attain a semiconductor layer shorter than in the past irrespective of the width of the wiring layer 13, the semiconductor layer being used to specify a predetermined channel length. Consequently, the benefits of the present invention can be obtained.

According to the above-described embodiments, the power line is provided for every two circuit columns arrays, power is supplied to each of circuits included in pixel arrays adjacent to each other across the power line, and the first contact pad and the first part R1 of the semiconductor layer of the transistor included in the circuit are shared among circuits adjacent to each other across the power line. However, without being limited to the above-described embodiments, the power line may be provided for each of the pixel arrays, which constitutes another embodiment of the present invention.

Figure 11A:
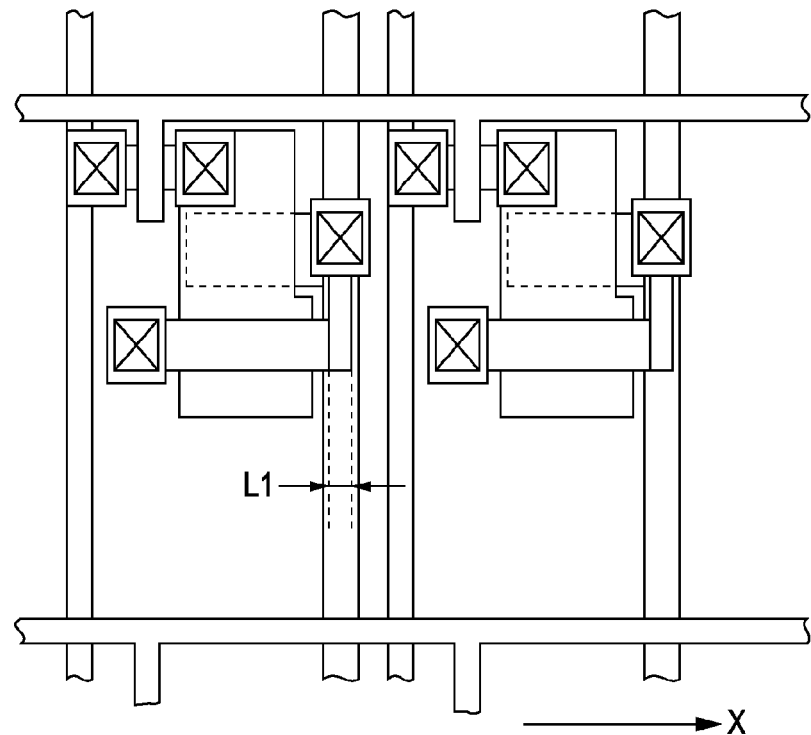
FIG. 11A shows a layout of a pixel circuit according to an embodiment of the present invention.
Figure 11B:
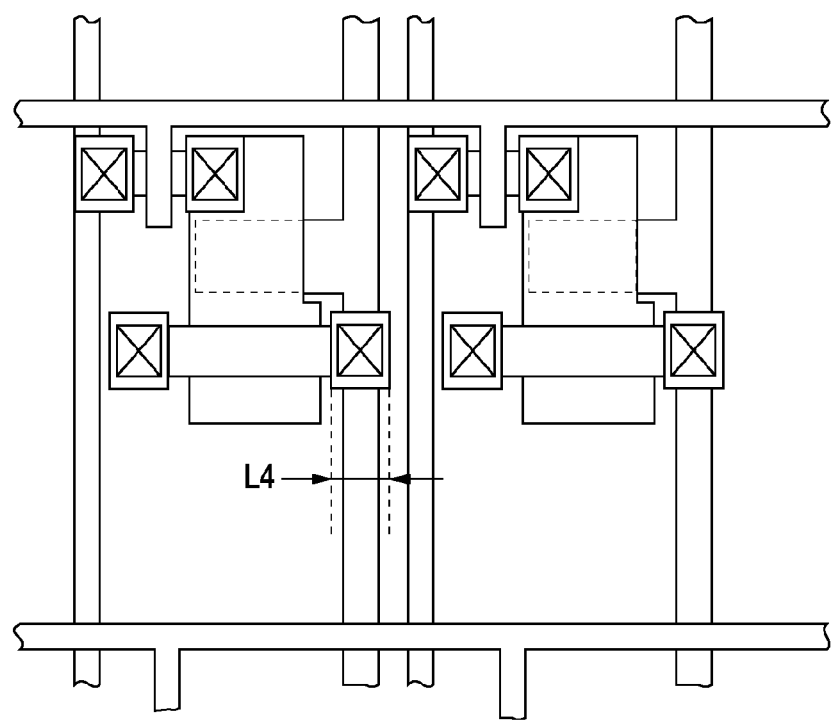
FIG. 11B shows a layout of a known pixel circuit.

Each of FIGS. 11A and 11B shows a layout of a pixel circuit including a power line provided for each of pixel arrays. FIG. 11A shows a layout of a pixel circuit according to an embodiment of the present invention, and FIG. 11B shows a layout of a known pixel circuit. As is the case with FIG. 6, the inequality L1<L0 holds in the example shown in FIG. 11A illustrating the embodiment of the present invention. Therefore, it becomes possible to make the X-direction length of the semiconductor layer shown in FIG. 11A smaller than that of the semiconductor layer shown in FIG. 11B illustrating the known pixel circuit, which makes it possible to achieve a pixel layout with high precision and a small pitch that are attained due to the small X-direction length.

Second Embodiment

Figure 8:
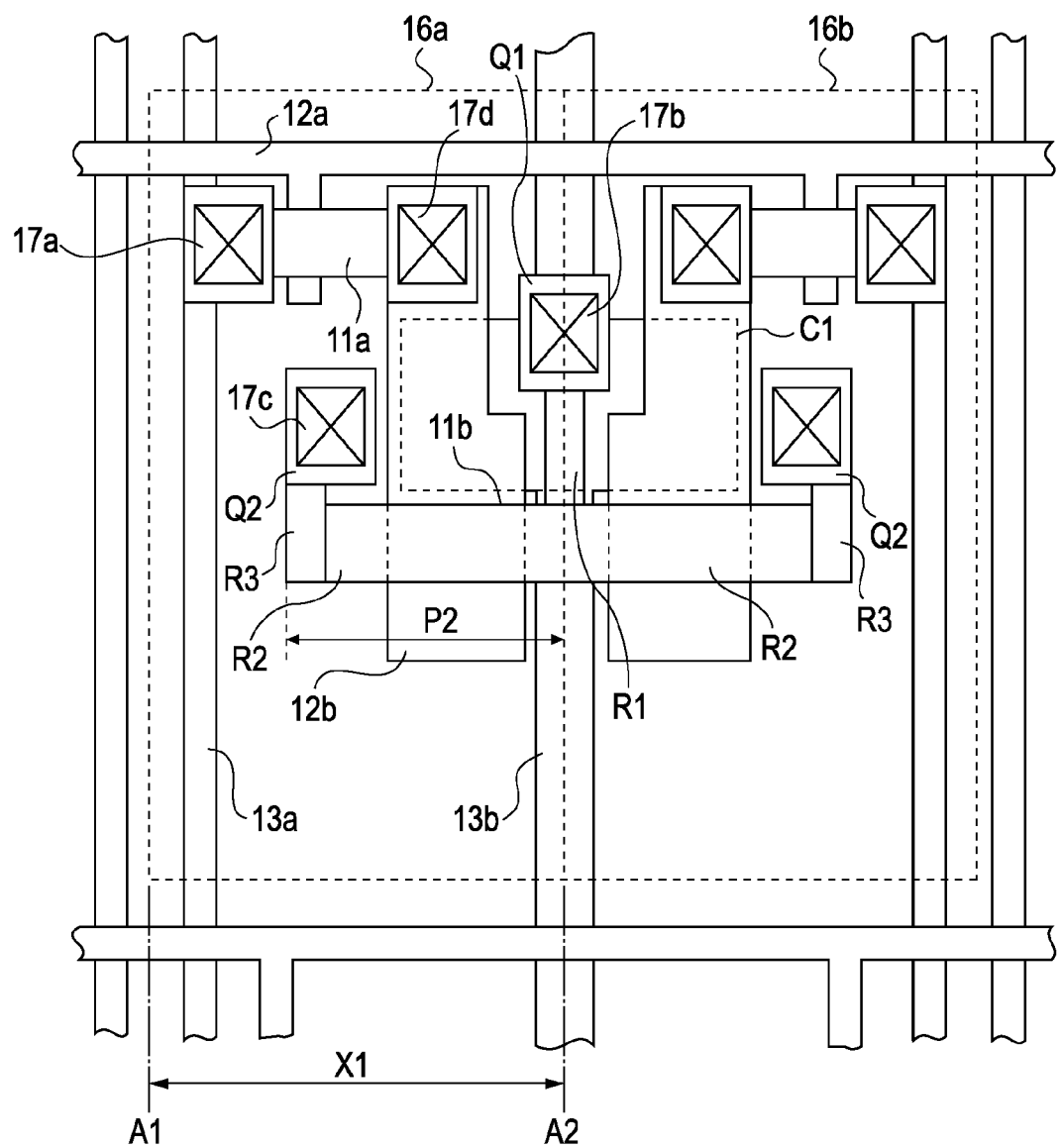
FIG. 8 shows a layout of a pixel circuit according to a second embodiment of the present invention.

FIG. 8 shows a layout of the pixel circuit shown in FIG. 2 according to a second embodiment of the present invention. The same functional components as those shown in FIG. 3 are designated by the same reference numerals.

The second embodiment is different from the first embodiment in that the third part R3 of the semiconductor layer 11*b* extends from an end of the second part R2 (the end distant from the first part R1) and the contact pad Q2 is formed on the tail end of the third part R3. Here, since a corner part abutting on the second part R2 and the third part R3 is not used to provide the channel, the corner part is included in the third part R3.

The contact pad Q2 is a connection end provided on the drain side of the driving transistor M2 and is connected to one of the electrodes of the EL element.

The third part R3 extends in the Y-direction at the light angle to the second part R2 forming the channel and the contact pad Q2 is provided so that the side of the contact pad Q2 abuts on the third part R3. When a side of the second contact pad, the side being distant from the power line, exists on a single line on which an edge opposite to the power line of the third part R3 exists, that is to say, when the second contact pad Q2 is provided so that the second contact pad Q2 does not lie off the third part R3, the X-direction width of a part of the cathode electrode 12, the part overlapping the second part R2, is extended and shaped like a hook. Consequently, it becomes possible to provide the contact pad Q2 at a position closer to the power line than in the past. Further, since the same current as that passing through the first part R1 passes through the third part R3, the third part R3 may have the same X-direction width (L1) as that of the first part R1.

As is the case with the first embodiment, the contact pad Q2 is provided to connect the semiconductor layer 11*b* to the drain electrode layer 13 and has the same configuration as that of the contact pad Q1. An X-direction width L4 of the contact pad Q2 is larger than the X-direction width of the third part R3 for the same reasons described regarding the width of each of the contact pad Q1 and the first part R1.

Therefore, the length P2 of the driving transistor M2, the length P2 being measured in the channel-length direction, is expressed by the following equation:

$$P2=L1/2+L2+L3+L3'+L1.$$

Although it stands to reason that the length P2 is smaller than the length P0, the length P2 is also smaller than the length P1, which is expressed by the following inequality:

$$P0>P1>P2.$$

The third part R3 may further extend from a part abutting on the second part R2. Namely, the second part R2 may abut on not the tail end of the third part R3 but a middle part of the third part R3. However, the middle part should be defined at a position away from the contact pad Q2.

Figure 9:
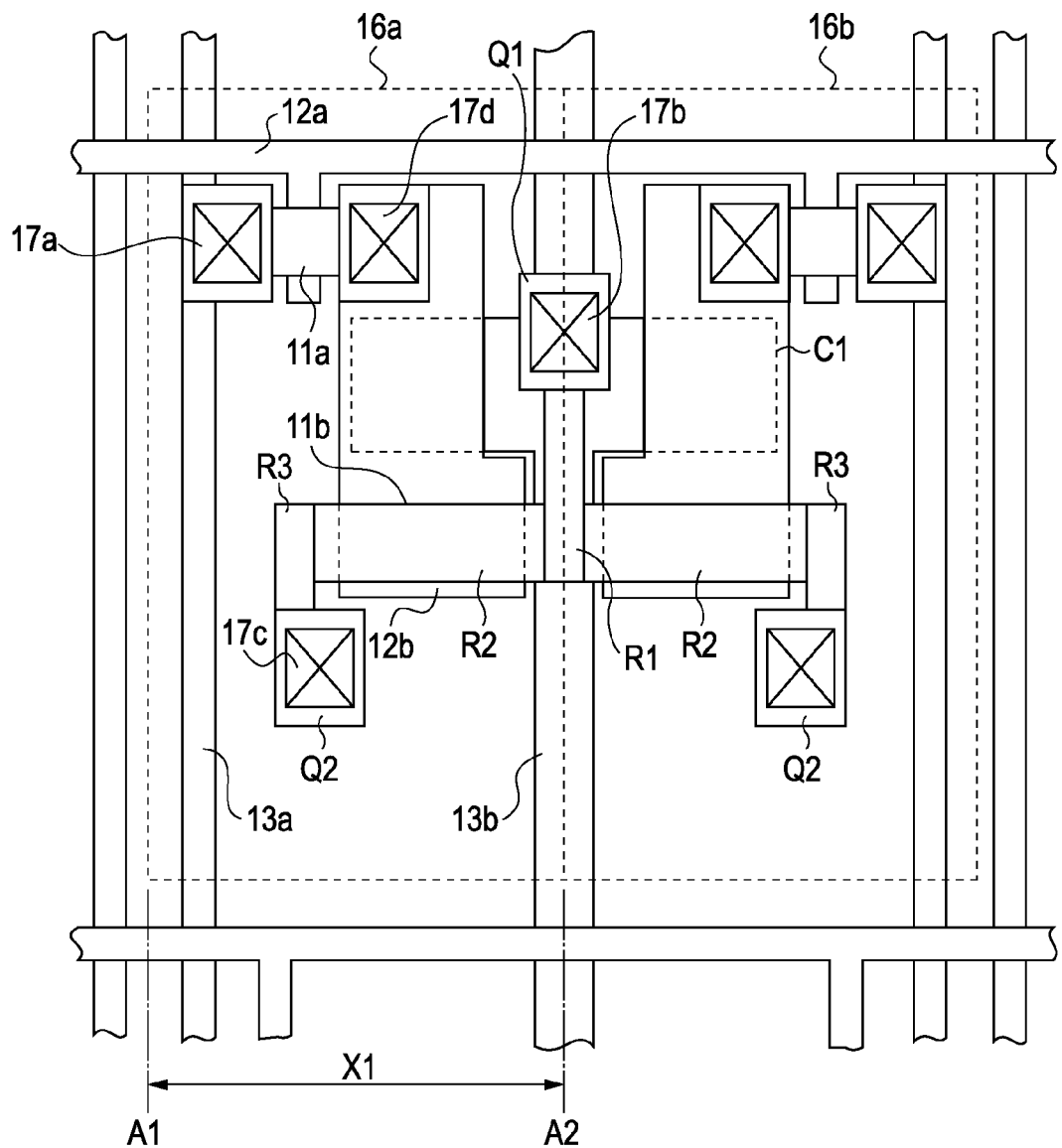
FIG. 9 shows another layout of the second embodiment.

Further, the third part R3 and the contact pad Q2 may be provided on the same side as that on which the first part R1 and the contact pad Q1 of the semiconductor layer are provided as shown in FIG. 8 with reference to the second part R2 of the semiconductor layer. Still further, the third part R3 and the contact pad Q2 may be provided on the opposite side with reference to the second part R2. FIG. 9 shows an example where the third part R3 and the contact pad Q2 are provided on the opposite side. In FIG. 9, the same functional components as those shown in FIG. 8 are designated by the same reference numerals.

The present invention is applied to a display device including display elements arranged in a matrix, and is particularly applied to a display device including a circuit configured to control the brightness of a self light emitting-type display element including, for example, an EL element emitting light through the current passage based on a current and/or a light emitting period.

Thus, according to the above-described embodiments, the second part of the semiconductor layer overlaps the gate electrode across the insulating layer so that the appropriate channel width and channel length are formed. The same descriptions apply to the case where the capacitance is provided. Namely, the present invention can be applied to the case where the second part of the semiconductor overlaps an electrode across the insulating layer so that the capacitance is provided, the electrode being formed at the same time as when the gate electrode is formed.

Hereinafter, an information display apparatus including a semiconductor device according to an embodiment of the present invention and a display element will be described. The information display apparatus may be a mobile phone, a mobile computer, a still camera, a video camera, and so forth. Otherwise, the information display apparatus achieves a plurality of functions of the above-described apparatuses and/or devices. The information display apparatus includes an information input unit. When the information display apparatus is the mobile phone, for example, the information input unit includes an antenna. When the information display apparatus is a personal digital assistant (PDA) and/or a mobile personal computer (PC), the information input unit includes a unit interfacing to a network. When the information display apparatus is the still camera and/or a movie camera, the information input unit includes a sensor unit provided as a charge-coupled device (CCD), a complementary metal oxide semiconductor (CMOS), and so forth.

Figure 10:
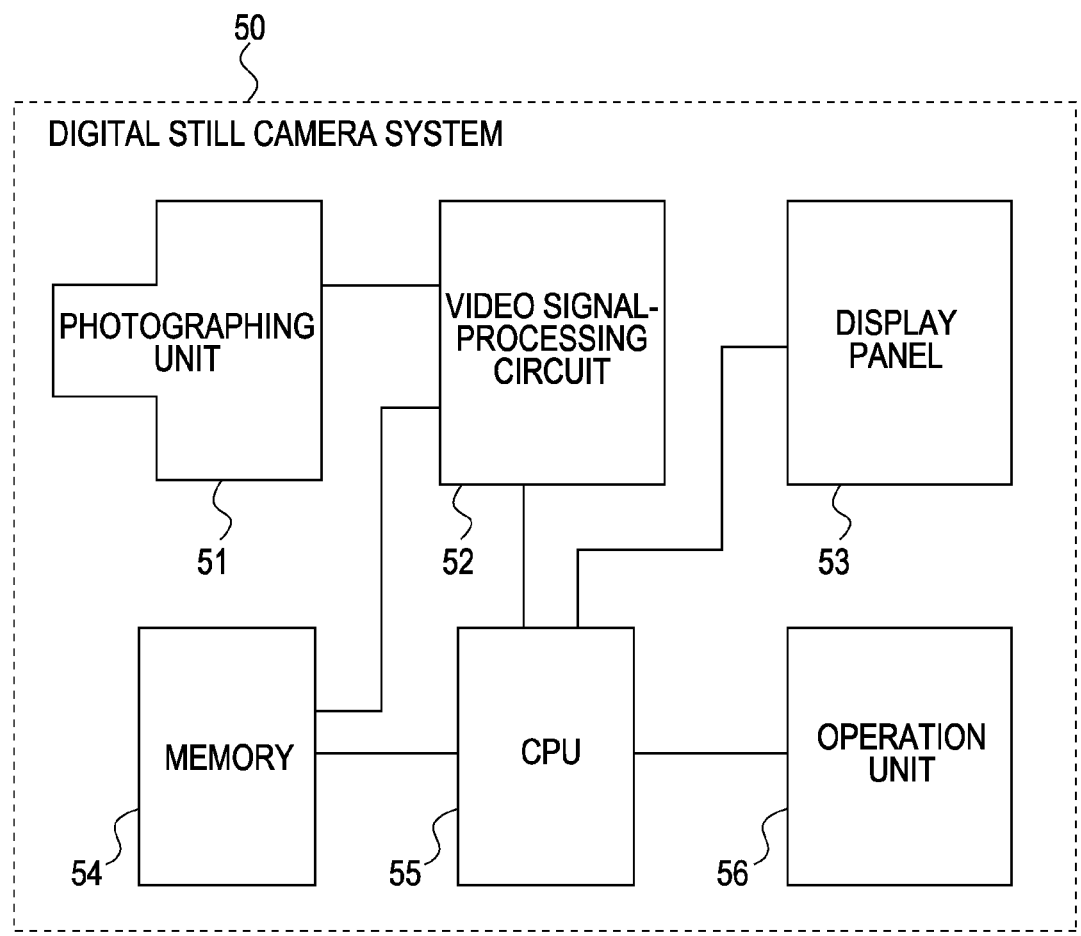
FIG. 10 is a block diagram of a digital still camera system.

FIG. 10 is a block diagram of an exemplary digital still camera system including a display apparatus using a semiconductor device according to an embodiment of the present invention. FIG. 10 shows a digital still camera system 50, a photographing unit 51, a video signal-processing circuit 52, a display apparatus 53, a memory 54, a central processing unit (CPU) 55, and an operation unit 56.

In FIG. 10, video data obtained through photographing performed through the photographing unit 51 and/or video data stored in the memory 54 is subjected to signal processing performed through the video signal-processing circuit 52 so that a user can view the video data displayed on the display apparatus 53. Upon receiving a signal transmitted from the operation unit 56, the CPU 55 controls the photographing unit 51, the memory 54, the video signal-processing circuit 52, and so forth to perform photographing, data storing, data reproduction, and data display, as appropriate. The display apparatus 53 can be used as the display unit of other various electronic devices.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-104213 filed on Apr. 22, 2009, and Japanese Patent Application No. 2010-68285 filed on Mar. 24, 2010, which are hereby incorporated by reference herein in their entirety.

What is claimed is:

1. A semiconductor device including a plurality of circuits and a plurality of light-emitting elements, where the circuit includes a power line which extends in a single direction to which a power potential is provided, a transistor for controlling a current of an EL element, and a gate electrode layer configured to form a channel of the transistor,
   wherein the transistor having a semiconductor layer,
   wherein the semiconductor layer includes:
      a first contact pad;
      a first part that is connected to the first contact pad and that extends along the power line;
      a second part that extends from the first part at a right angle; and
      a second contact pad where the first part and the second part are arranged between the second contact pad and the first contact pad,
   wherein the first contact pad electrically connects to the power line,
      wherein the gate electrode layer has a rectangle projecting part in the direction of the first part,
      wherein the rectangle projecting part of the gate electrode layer has a first side parallel to the extending direction of the first part,
      wherein a part that is not projecting at the gate electrode layer has a second side parallel to the first side and next to a side of the first part,
      wherein the second part intersects with the first side by sandwiching the gate electrode layer and an insulating layer,
      wherein the first side does not face any one of sides of the first contact pad, and
      wherein the semiconductor layer includes a third part that extends from the second part along the power line, and wherein the second contact pad abuts on an end of the third part.

2. The semiconductor device according to claim 1, wherein a dimension of the second contact pad is larger than the dimension of the third part, the dimension being defined in the direction perpendicular to the power line.

3. The semiconductor device according to claim 2, wherein a side of the second contact pad, the side being distant from the first part, is on a single line on which an edge of the third part is, the edge being distant from the first part.

4. The semiconductor device according to claim 1, wherein the plurality of circuits include a plurality of circuit arrays arranged along the power line, and the power line is provided for every two circuit arrays to supply power to each of circuits included in circuit arrays that are adjacent to each other across the power line, and
wherein the first contact pad and the first part are shared among the circuit arrays that are adjacent to each other across the power line.

5. The semiconductor device according to claim 1, wherein a distance between a center line of the power line and the first side, is shorter than the distance between a center line of the power line and the side parallel to the first part of the first contact pad.

6. The semiconductor device according to claim 1,
wherein the circuit includes a capacitor connected to the gate of the transistor, and
wherein the part that is not projecting at the gate electrode layer having a second side parallel to the first side and next to a side of the first part functions as one of the electrodes of the storage capacitor.

7. The semiconductor device according to claim 1,
wherein the circuit includes a switching transistor, and
wherein the part that is not projecting at the gate electrode layer having a second side parallel to the first side and next to a side of the first part intersects with the drain or the source of the switching transistor.

8. The semiconductor device according to claim 1, wherein the second side is opposed to a side parallel to the power line of the first contact pad.

9. A semiconductor device including a plurality of circuits and a plurality of light-emitting elements, where the circuit includes a power line which extends in a single direction to which a power potential is provided, a transistor for controlling a current of an EL element, and a gate electrode layer configured to form a channel of the transistor,
wherein the transistor having a semiconductor layer,
wherein the semiconductor layer includes:
a first contact pad;
a first part that is connected to the first contact pad and that extends along the power line;
a second part that extends from the first part at a right angle; and
a second contact pad where the first part and the second part are arranged between the second contact pad and the first contact pad,
wherein the first contact pad electrically connects to the power line,
wherein the gate electrode layer has a rectangle projecting part in the direction of the first part,
wherein the rectangle projecting part of the gate electrode layer has a first side parallel to the extending direction of the first part,
wherein a part that is not projecting at the gate electrode layer has a second side parallel to the first side and next to a side of the first part,
wherein the second part intersects with the first side by sandwiching the gate electrode layer and an insulating layer,
wherein the first side does not face any one of sides of the first contact pad, and
wherein a dimension of the first contact pad, is larger than the dimension of the first part, the dimension being defined in a direction perpendicular to the power line.

10. The semiconductor device according to claim 9, wherein the plurality of circuits include a plurality of circuit arrays arranged along the power line, and the power line is provided for every two circuit arrays to supply power to each of circuits included in circuit arrays that are adjacent to each other across the power line, and
wherein the first contact pad and the first part are shared among the circuit arrays that are adjacent to each other across the power line.

11. The semiconductor device according to claim 9, wherein a distance between a center line of the power line and the first side, is shorter than the distance between a center line of the power line and the side parallel to the first part of the first contact pad.

12. The semiconductor device according to claim 9,
wherein the circuit includes a capacitor connected to the gate of the transistor, and
wherein the part that is not projecting at the gate electrode layer having a second side parallel to the first side and next to a side of the first part functions as one of the electrode of the storage capacitor.

13. The semiconductor device according to claim 9,
wherein the circuit includes a switching transistor, and
wherein the part that is not projecting at the gate electrode layer having a second side parallel to the first side and next to a side of the first part intersects with the drain or the source of the switching transistor.

14. The semiconductor device according to claim 9, wherein the second side is opposed to a side parallel to the power line of the first contact pad.

* * * * *